(12) United States Patent
Van Cleemput

(10) Patent No.: US 10,246,774 B2
(45) Date of Patent: Apr. 2, 2019

(54) ADDITIVE FOR ALD DEPOSITION PROFILE TUNING IN GAP FEATURES

(71) Applicant: Lam Research Corporation, Fremont, CA (US)

(72) Inventor: Patrick Van Cleemput, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 10 days.

(21) Appl. No.: 15/235,549

(22) Filed: Aug. 12, 2016

(65) Prior Publication Data

US 2018/0044790 A1    Feb. 15, 2018

(51) Int. Cl.
*C23C 16/00* (2006.01)
*C23C 16/455* (2006.01)
*C23C 16/04* (2006.01)
*C23C 16/40* (2006.01)

(52) U.S. Cl.
CPC ...... *C23C 16/45525* (2013.01); *C23C 16/045* (2013.01); *C23C 16/402* (2013.01); *C23C 16/45534* (2013.01)

(58) Field of Classification Search
None
See application file for complete search history.

(56) References Cited

U.S. PATENT DOCUMENTS

| | | | |
|---|---|---|---|
| 6,846,516 B2* | 1/2005 | Yang | C23C 16/45531 427/255.32 |
| 7,160,819 B2 | 1/2007 | Conley, Jr. et al. | |
| 2003/0106490 A1* | 6/2003 | Jallepally | C23C 16/45521 117/89 |
| 2008/0032041 A1* | 2/2008 | Marcadal | C23C 16/18 427/126.1 |
| 2011/0124204 A1* | 5/2011 | Ota | C23C 16/402 438/787 |
| 2012/0276306 A1* | 11/2012 | Ueda | C23C 16/04 427/576 |
| 2015/0243545 A1* | 8/2015 | Tang | H01L 21/76224 438/430 |

(Continued)

OTHER PUBLICATIONS

C.C. Ballard et al., "Esterification of the Surface of Amorphous Silica," The Journal of Physical Chemistry, vol. 65, No. 1, (1961), pp. 20-25.

(Continued)

*Primary Examiner* — David P Turocy

(74) *Attorney, Agent, or Firm* — Penilla IP, APC

(57) ABSTRACT

A method for performing atomic layer deposition (ALD) on a substrate is provided, including: exposing the substrate to a first reactant and an additive simultaneously, the first reactant and the additive being configured to adsorb on exposed surfaces of the substrate, a partial pressure of the additive being configured so that adsorption of the additive in a gap feature of the substrate decreases as depth increases in the gap feature; after exposing the substrate to the first reactant and the additive, exposing the substrate to a second reactant, the second reactant configured to react with the adsorbed first reactant to form a thin film product, the second reactant configured to react with the adsorbed additive to remove the adsorbed additive from the substrate surface.

12 Claims, 6 Drawing Sheets

(56) References Cited

U.S. PATENT DOCUMENTS

2016/0071953 A1     3/2016    Mountsier et al.
2016/0148800 A1     5/2016    Henri et al.
2017/0114459 A1*   4/2017    Saly .................. H01L 21/02274

OTHER PUBLICATIONS

Raymond G. Azrak and C.L. Angell, "Study of Alcohol-Silica Surface Reactions via Infrared Spectroscopy," The Journal of Physical Chemistry, vol. 77, No. 26, (1973), pp. 3048-3052.

G.B. Raupp and T.S. Cale, "Step Coverage Prediction in Low-Pressure Chemical Vapor Deposition," Chemistry of Materials, vol. 1, No. 2 (1989), pp. 207-214.

M. Zaborski et al., "Comparative Study of the Surface Hydroxyl Groups of Fumed and Precipitated Silicas. 1. Grafting and Chemical Characterization," Langmuir, vol. 5, No. 2, (1989), pp. 447-451.

Seshadri Ganguli et al., "Theory of Free Boundary Step Coverage in Chemical Vapor Deposition," Ind. Eng. Chem. Res., vol. 34, No. 10 (1995), pp. 3380-3391.

Husain Ali Al-Mohssen, "Chemical Vapor Deposition Models Using Direct Simulation Monte Carlo with Non-Linear Chemistry and Level Set Profile Evolution," Massachusetts Institute of Technology, Dept. of Mechanical Engineering (2003), pp. 1-69.

* cited by examiner ature sizes shrink, achieving conformal deposition in high aspect ratio features becomes ever more challenging. For example, it is difficult to achieve good step coverage in gap features (e.g. trenches or holes) less than 25 nanometers wide with aspect ratios in the range of 30:1. Atomic layer deposition (ALD) is a technique that is ostensibly well-suited to provide conformal coverage, as individual monolayers of a desired film can be deposited by ALD until the desired film thickness is achieved. However, ALD for gap-fill suffers from the fact that it is difficult to achieve adequate diffusion of reactant gas into high aspect ratio features in limited amounts of time. Because an ALD process may be repeated hundreds of times in order to achieve the desired film thickness, the effect of requiring additional time to achieve conformal coverage by ALD can be magnified to a large extent and detrimental to throughput.

ADDITIVE FOR ALD DEPOSITION PROFILE TUNING IN GAP FEATURES

BACKGROUND

1. Field of the Disclosure

The present implementations relate to methods for depositing thin films, and more specifically, to atomic layer deposition (ALD) and chemical vapor deposition (CVD) of thin films.

2. Description of the Related Art

As feature sizes shrink, achieving conformal deposition in high aspect ratio features becomes ever more challenging. For example, it is difficult to achieve good step coverage in gap features (e.g. trenches or holes) less than 25 nanometers wide with aspect ratios in the range of 30:1. Atomic layer deposition (ALD) is a technique that is ostensibly well-suited to provide conformal coverage, as individual monolayers of a desired film can be deposited by ALD until the desired film thickness is achieved. However, ALD for gap-fill suffers from the fact that it is difficult to achieve adequate diffusion of reactant gas into high aspect ratio features in limited amounts of time. Because an ALD process may be repeated hundreds of times in order to achieve the desired film thickness, the effect of requiring additional time to achieve conformal coverage by ALD can be magnified to a large extent and detrimental to throughput.

It will be appreciated that inadequate diffusion into gap features results in a deposition profile wherein coverage along sidewalls of a feature decreases with increasing depth. With repeated deposition operations, this can lead to "pinch-off," wherein a void is formed as the uppermost portion of the feature is completely horizontally filled before the rest of the feature.

However, even if conformal deposition by ALD is achieved, there is typically still a seam that remains at the center of the trench/hole, which may cause problems by exhibiting different behavior (e.g. higher etch rates) than other portions of the deposited film during subsequent processing steps.

One approach for solving these issues is to deposit an inhibitor between the first and second dosing steps of the ALD process. Examples employing such a strategy include U.S. patent application Ser. No. 14/630,852, filed Feb. 25, 2015, entitled "Inhibitor Plasma Mediated Atomic Layer Deposition for Seamless Feature Fill," and U.S. patent application Ser. No. 14/552,011, filed Nov. 24, 2014, entitled "Selective Inhibition in Atomic Layer Deposition of Silicon-Containing Films," the disclosures of which are incorporated by reference. However, these approaches require an additional step for every ALD cycle. As the ALD cycle may be repeated hundreds of times to achieve a desired thickness, even short increases in the time to complete a cycle are magnified and may have an extremely negative impact on throughput. Furthermore, these processes may require plasma which can damage or chemically modify the layers on which deposition is to occur.

It is in this context that implementations of the disclosures arise.

SUMMARY

Implementations of the present disclosure provide methods, apparatus, and systems to enable modulation and control of step coverage in high aspect ratio gap features.

A method for performing atomic layer deposition (ALD) on a substrate is provided, including: exposing the substrate to a first reactant and an additive simultaneously, the first reactant and the additive being configured to adsorb on exposed surfaces of the substrate, a partial pressure of the additive being configured so that adsorption of the additive in a gap feature of the substrate decreases as depth increases in the gap feature; after exposing the substrate to the first reactant and the additive, exposing the substrate to a second reactant, the second reactant configured to react with the adsorbed first reactant to form a thin film product, the second reactant configured to react with the adsorbed additive to remove the adsorbed additive from the substrate surface.

In some implementations, the additive is configured to compete with the first reactant for available adsorption locations on the exposed surfaces of the substrate, the first reactant and the additive being configured to adsorb as a self-limiting monolayer, wherein adsorption of the additive prevents formation of the thin film product at locations where the additive adsorbed on the substrate surface.

In some implementations, the partial pressure of the additive is significantly less that a partial pressure of the first reactant.

In some implementations, the partial pressure of the additive is configured to prevent diffusion of the additive to a bottom of the gap feature; wherein a partial pressure of the first reactant is configured to enable diffusion of the first reactant to the bottom of the gap feature.

In some implementations, a temperature of the process chamber is controlled to provide for the partial pressures of the first reactant and the additive.

In some implementations, the method further includes: repeating the operations of exposing the substrate to the first reactant and the additive simultaneously, and exposing the substrate to the second reactant, for a predefined number of cycles so as to deposit multiple layers of the thin film product, wherein a deposition amount of the thin film product along sidewalls of the gap feature increases with increasing depth in the gap feature.

In some implementations, exposing the substrate to the first reactant and the additive includes, pulsing the first reactant and the additive into a carrier gas stream that is flowed into a process chamber in which the substrate is disposed; wherein exposing the substrate to the second reactant includes, pulsing the second reactant into the carrier gas stream.

In some implementations, after exposing the substrate to the first reactant and the additive simultaneously, a first purge operation is performed to remove unreacted quantities of the first reactant and the additive from the process chamber; wherein after exposing the substrate to the second reactant, a second purge operation is performed to remove unreacted quantities of the second reactant, and quantities of the deposited additive that have been removed from the substrate surface, from the process chamber.

In some implementations, performing the first purge operation includes continuing the flow of the carrier gas stream through the process chamber and evacuating the process chamber so as to remove the unreacted quantities of the first reactant and the additive from the process chamber; wherein performing the second purge operation includes continuing the flow of the carrier gas stream through the process chamber and evacuating the process chamber so as to remove the unreacted quantities of the second reactant, and the quantities of the deposited additive that have been removed from the substrate surface, from the process chamber.

In some implementations, the thin film product is an oxide of silicon; wherein the first reactant is a silicon-containing precursor.

In some implementations, the first reactant is diisopropylaminosilane (DIPAS), bis(diethylamine)silane (BDEAS) or bis(tertiarybuthylamine)silane (BTBAS).

In some implementations, the additive is an alcohol.

In some implementations, the additive is an organoamine.

DESCRIPTION

Implementations of the disclosure provide methods, apparatus, and systems for deposition of thin films. It should be appreciated that the present implementations can be implemented in numerous ways, such as a process, an apparatus, a system, a device, or a method. Several implementations are described below.

A general atomic layer deposition (ALD) process consists of sequential alternating pulses of gaseous chemical reactants that react with the substrate surface. The individual gas-surface reactions of each reactant are called half-reactions. During the first half-reaction, a first reactant is pulsed into a chamber for a designated amount of time to allow the first reactant to fully react with the substrate surface through a self-limiting process that deposits a single monolayer on the substrate surface. Subsequently, the chamber is purged with an inert carrier gas (typically $N_2$ or Ar) to remove any unreacted first reactant or reaction by-products. This is then followed by a pulse of a second reactant, which reacts with the previously deposited first reactant, creating up to one layer of the desired material at the substrate surface. A subsequent second purge is performed to remove any unused second reactant and/or reaction by-products. This process is then cycled until a desired film thickness is achieved.

Broadly speaking, implementations of the present disclosure provide methods and systems for modulating atomic layer deposition (ALD) step coverage of gap features (e.g. trenches and holes), thereby enabling conformal deposition even in high aspect ratio features. In accordance with various implementations, an additive is provided in combination with the first reactant during the first dosing step of an ALD process. The additive is configured to compete for the same adsorption sites as the first reactant, and is provided at a partial pressure so as to adsorb onto the sidewalls of a gap feature with decreasing coverage as depth increases.

Adsorbed additive on the sidewalls prevents the first reactant from adsorbing at the same locations, and thus effectively blocks the deposition of the desired material at such locations. The adsorbed additive is configured to be desorbed during the second dosing step when exposed to a second reactant. Because the adsorption of the additive, and its resultant effect of blocking deposition of the film material, occurs with increased coverage at shallower depths and decreased coverage at deeper depths, this enables deposition of the desired material in a converse manner, such that deposition coverage of the desired material increases with increasing depth in the gap feature.

Figure 1:
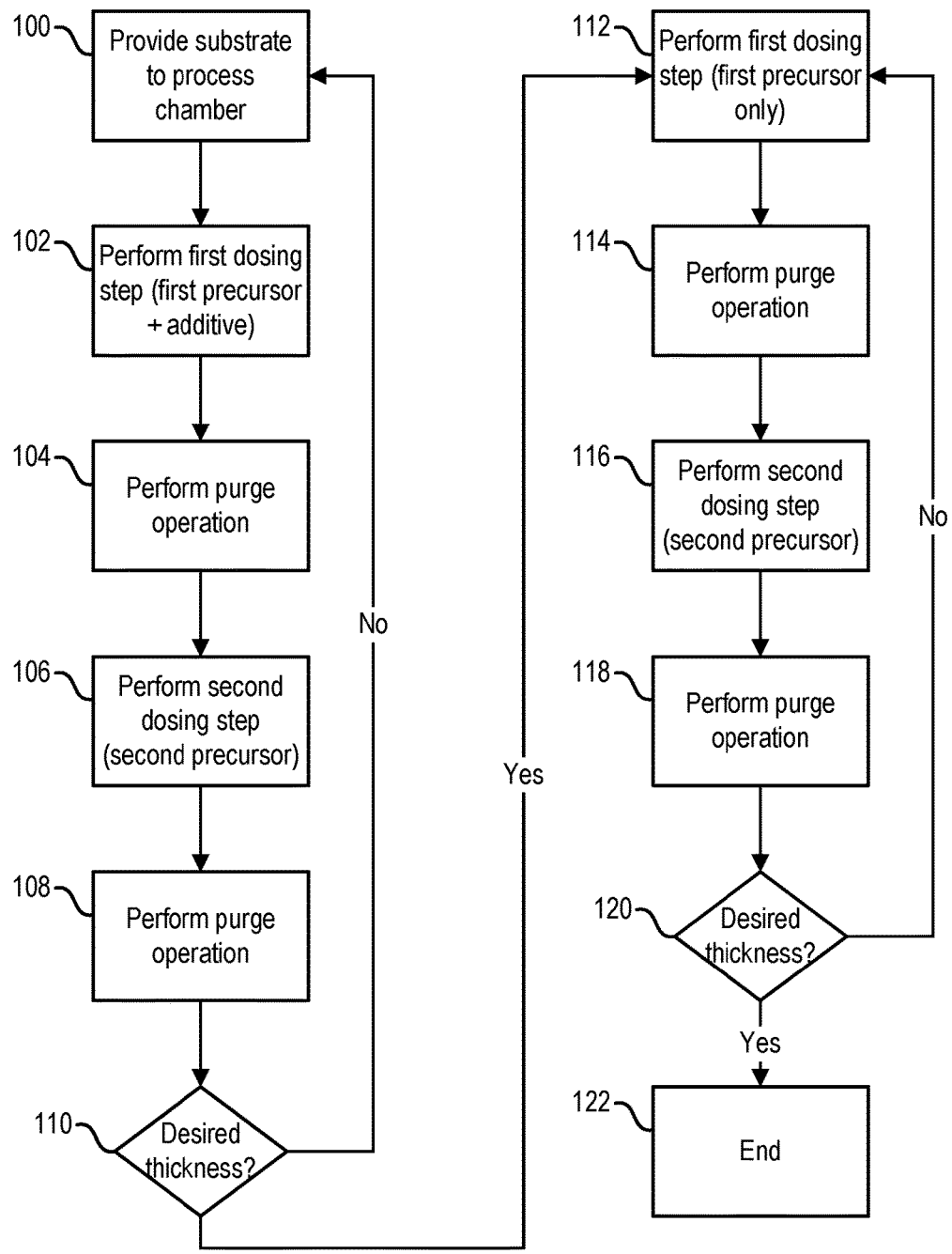
FIG. 1 illustrates a method for performing an ALD process, in accordance with implementations of the disclosure.

FIG. 1 illustrates a method for performing an ALD process, in accordance with implementations of the disclosure. At method operation 100, a substrate is provided to a process chamber in which deposition is carried out. At method operation 102, a first dosing step is performed, in which the substrate is exposed to a first reactant and an additive simultaneously. The additive is competitive with the first reactant for adsorption sites on the substrate surface, and the additive and the first reactant are respectively provided at partial pressures that provide for adsorption of the additive along sidewalls of a gap feature with decreasing coverage as depth increases, and adsorption of the first reactant along the sidewalls with increasing coverage as depth increases.

At method operation 104, a purge operation is performed, removing unreacted species from the process chamber. In some implementations, a purge operation is performed by flowing an inert gas into the process chamber.

At method operation 106, a second dosing step is performed, in which the substrate is exposed to a second reactant. The second reactant reacts with the first reactant to form the desired thin film product. The second reactant reacts with the additive so as to remove the additive from the substrate surface.

At method operation 108, another purge operation is performed. It will be appreciated that method operations 102, 104, 106, and 108 together define one complete ALD cycle using the additive.

At method operation 110, it is determined whether a desired thickness has been achieved, and if not, then operations 102, 104, 106, and 108 are repeated. In this manner, a series of ALD cycles (including the additive in the first dosing step) is performed until the desired thickness is achieved. In some implementations, the deposition of the thin film is complete upon reaching the desired thickness.

In some implementations, the above-described ALD process using the additive can be tuned for a deposition profile that provides increased deposition of the thin film with increasing depth in a gap feature. The result is a gap-fill process that provides a bottom-up filling of the gap feature. As the gap feature is filled from the bottom up, the depth remaining to be filled may eventually be reduced to a threshold depth at which it is no longer necessary to include the additive to achieve suitable gap-fill. Therefore, in accordance with some implementations, this threshold depth may correspond to the desired thickness having been achieved through the above-described series of ALD cycles using the additive.

Thus, when it is determined that the desired thickness is achieved at method operation 110, then at method operation 112, the method may optionally switch to an ALD procedure without the inclusion of the additive, wherein the first dosing step includes the first reactant gas but not the additive. At method operation 114, a purge operation is performed. At method operation 116, a second dosing step is performed, exposing the substrate to the second reactant. At method operation 118, another purge operation is performed.

At method operation 120, it is determined whether a desired thickness has been achieved, and if not, then operations 112, 114, 116, and 118 are repeated until the desired thickness is achieved. It will be appreciated that the operations 112, 114, 116, and 118 define one complete ALD cycle without the inclusion of the additive. The desired thickness in this case can be the thickness of the total deposited film (including the portion deposited by ALD using the additive), or the thickness of only the portion being deposited by ALD without using the additive. If the desired thickness has been achieved, then at operation 122, the method ends.

It will be appreciated that variations on the above method may be implemented to tune the deposition profile to a desired state, and to effect changes in the deposition profile over time as the gap feature is filled through successive ALD cycles. For example, in the above-described method, two series of ALD deposition cycles have been described—a first series of ALD cycles using the additive, and a second series of ALD cycles without the additive. However, in other implementations, there may be one or more additional series of ALD cycles with varying amounts of the additive being applied relative to amounts of the first reactant species. In some implementations, there are multiple series of ALD cycles, with successive series of ALD cycles employing the additive in successively reduced amounts (reduced partial pressures) relative to the first reactant during the first dosing step. In other words, as ALD cycles progress over time, there is a stepwise reduction in the partial pressure of the additive included during the first dosing step. The partial pressure of the first reactant may be held constant, or increased to offset the changes in the partial pressure of the additive. In various implementations the partial pressure of an inert carrier gas may also be held constant, or increased to offset the changes in the partial pressure of the additive.

In some implementations, throughout a series of ALD cycles, the partial pressure of the additive is progressively reduced with each successive ALD cycle. In some implementations, such a series may effect complete gap-fill of a gap feature. In other implementations, such a series may be combined with other series of ALD cycles that differ in terms of the reduction, if at all, in partial pressure of the additive. For example, other series may maintain the partial pressure of the additive at a constant level throughout, or simply not include the additive (constant partial pressure of zero). Or other series may reduce the partial pressure with each successive ALD cycle, but at a different rate or with different progression of reductions in the partial pressure of the additive. It should be appreciated that as the partial pressure of the additive is varied, so also the partial pressures of the first reactant and/or a carrier gas can also be varied, and that in some implementations, one or both are varied so as to provide for a constant total pressure as the partial pressure of the additive is varied in different ALD cycles.

It will be appreciated that the partial pressure of the additive, and changes in it over time, can be tuned to provide for a desired deposition profile. In some implementations, the partial pressure of the additive is set and/or adjusted over time to enable substantially even step coverage in gap features, so that deposition rates along the bottoms and sidewalls of gap features are substantially similar or the same. For example, this may be desirable when the goal of the deposition operation is to deposit a conformal layer of material without completely filling the gap feature. In some implementations, the partial pressure of the additive is set and/or adjusted to enable increased deposition rates with increasing depth in the gap feature. This can be advantageous for purposes of filling the gap feature, as the gap feature will be filled from the bottom up, preventing creation of a void (pinch-off) and reducing or eliminating the possibility of a seam being created.

Figure 2:
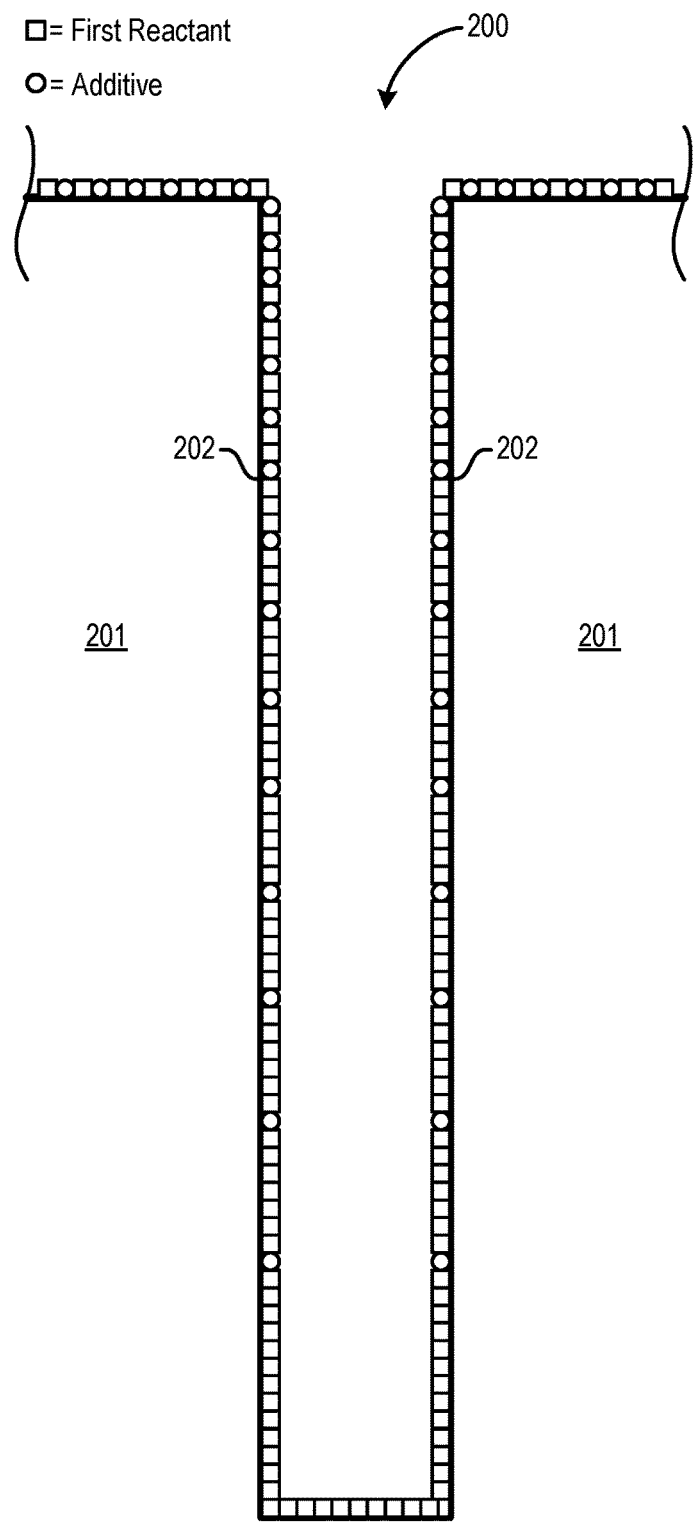
FIG. 2 is a cross-sectional view of a gap feature 200, in accordance with implementations of the disclosure.

FIG. 2 is a cross-sectional view of a gap feature 200, in accordance with implementations of the disclosure. As shown, the gap feature 200 may be a trench or hole in a substrate 201. The gap feature 200 has a high aspect ratio (e.g. about 10:1 or greater in some implementations, about 20:1 or greater in some implementations, about 30:1 or greater in some implementations, etc.) with sidewalls 202 and a bottom 204.

Conceptually shown are first reactant molecules 206 and additive molecules 208. The first reactant and the additive are provided during the first dosing step of an ALD process. As noted, the partial pressures of the first reactant and the additive are controlled to provide for adsorption of the additive in decreasing amounts with increasing depth in the gap feature 200, and concomitantly, adsorption of the first reactant in increasing amounts with increasing depth in the gap feature. The partial pressure of the additive and the first reactant are controlled so as to limit the diffusion of the additive 208 to the bottom of the gap feature 200. In practice, this may require provision of the additive at a low partial pressure to limit diffusion of the additive to the bottom, and provision of the first reactant at high partial pressure to allow for easy diffusion of the first reactant to the bottom of the gap feature 200.

This produces different growth rates along the depth of the gap feature. In the illustrated implementation, higher growth rates are achieved towards the bottom and slower growth rates towards the top of the gap feature 200. This is due to the effect of the additive which adsorbs with greater density towards the top of the gap feature 200, and lower density towards the bottom of the gap feature 200. The adsorbed additive prevents adsorption of the first reactant at the same locations, and thereby prevents formation of the thin film material at those locations. During the first dosing step of an ALD cycle, the additive behaves in a manner similar to the first reactant, as the additive competes for, and adsorbs to, the same adsorption sites as the first reactant. The additive, like the first reactant, adsorbs in a self-limiting fashion so as to form a monolayer on the surfaces of the substrate. Furthermore, the combination of the additive and the first reactant adsorb in a self-limiting fashion, so as to form a monolayer of adsorbed molecules on the exposed surfaces of the substrate having available adsorption sites. Thus, the additive does not adsorb on the first reactant, nor does the first reactant adsorb on the additive. The additive thus behaves in a similar manner as the first reactant during the first dosing step. However, during the second dosing step, adsorbed additive molecules are removed from their adsorption sites, whereas adsorbed first reactant molecules are converted to the desired final deposition product.

Figure 3:
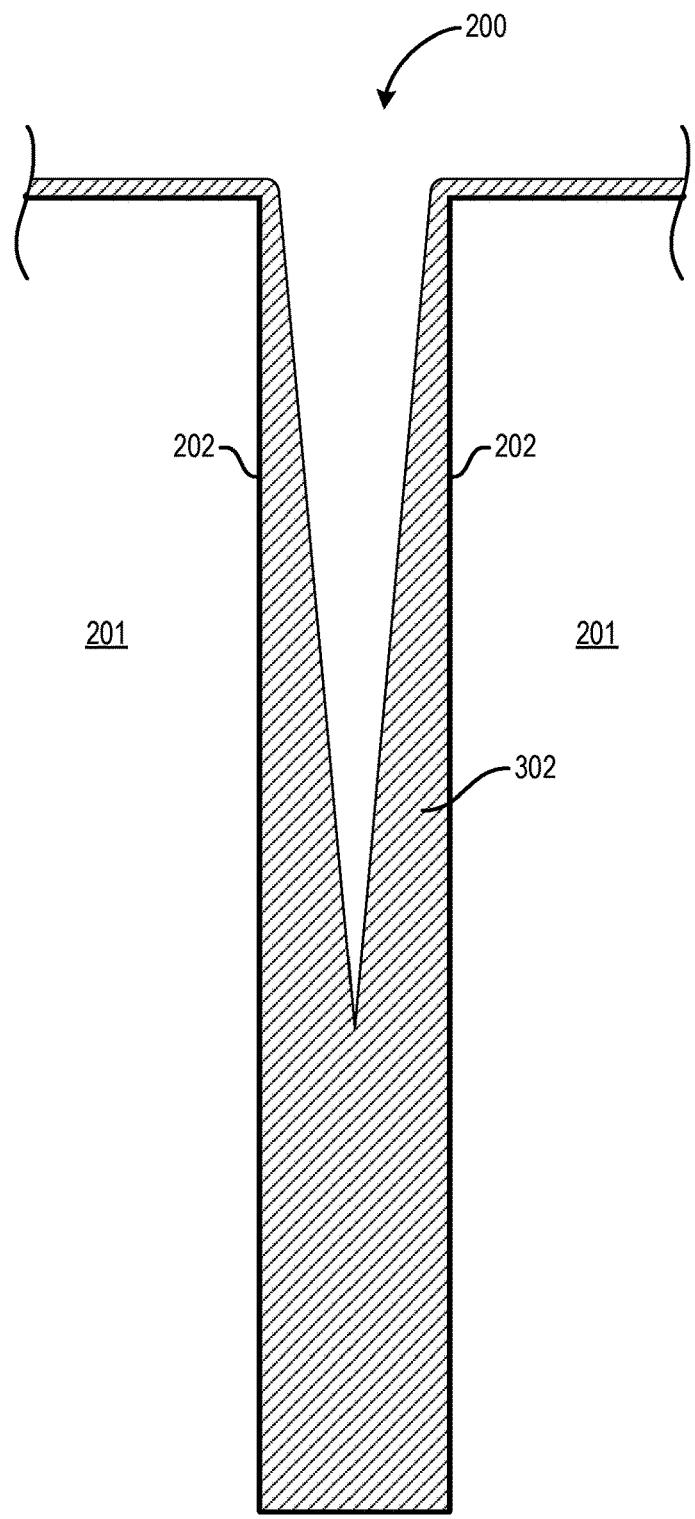
FIG. 3 illustrates a cross-section view of the gap feature following repeated ALD cycles using an additive, in accordance with implementations of the disclosure.

FIG. 3 illustrates a cross-section view of the gap feature following repeated ALD cycles using an additive, in accordance with implementations of the disclosure. In the illustrated implementation, the partial pressures of the additive and the first reactant have been tuned to provide for faster deposition at deeper portions of the gap feature.

Thus as shown, the deposition profile is such that after a number of ALD cycles, there is increased deposition of the desired thin film 302 with increasing depth in the gap feature 200 (e.g. increased deposition thickness as depth increases). Along the sidewalls 202, deposition thickness increases with increasing depth, with the lower/bottom portion of the gap feature 200 being completely filled.

Figure 4:
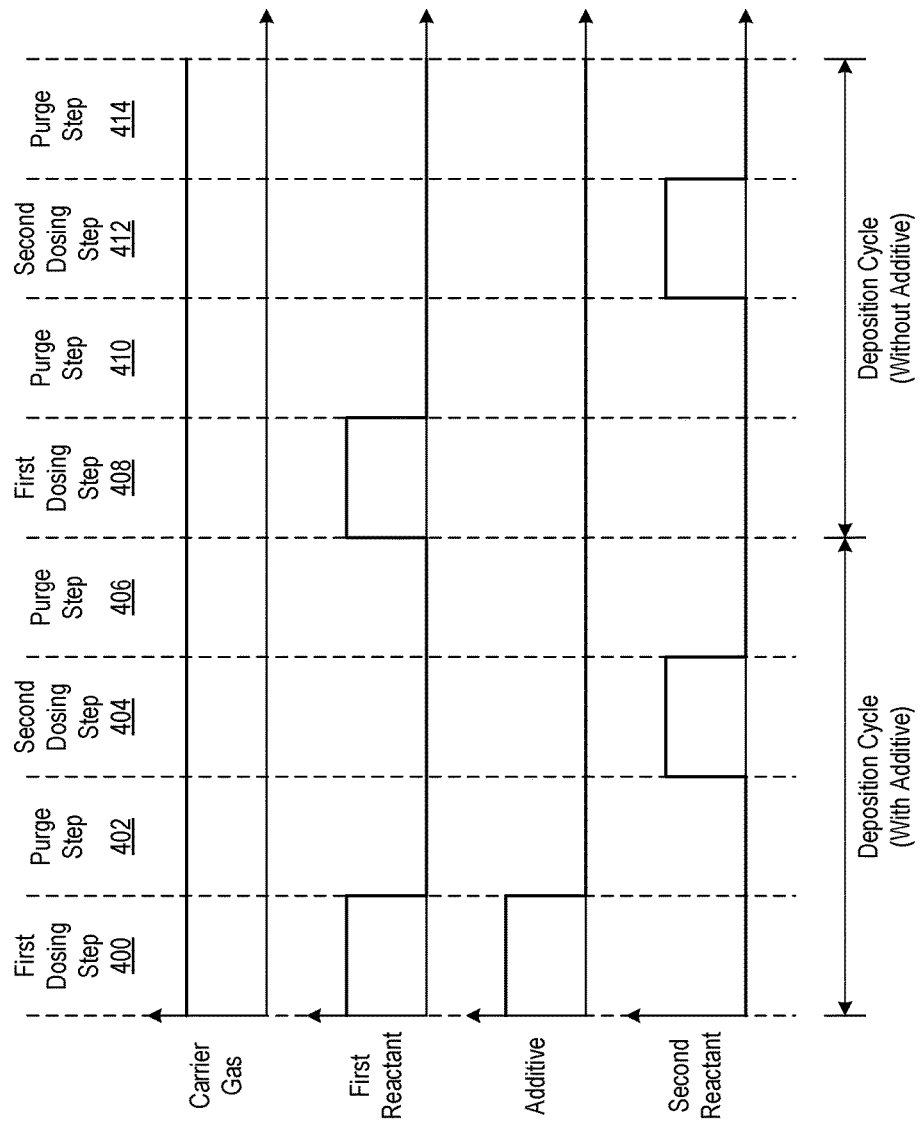
FIG. 4 is a timing sequence diagram illustrating flow/pulses of gas into a process chamber during performance of ALD operations, in accordance with implementations of the disclosure.

FIG. 4 is a timing sequence diagram illustrating flow/pulses of gas into a process chamber during performance of ALD operations, in accordance with implementations of the disclosure. The various curves indicate when the flow of a given gas is turned on or off, so as to define various phases of an ALD deposition process. In the illustrated implementation, a complete ALD deposition cycle with an additive is shown, followed by a complete ALD deposition cycle without the additive. The ALD deposition cycle with the additive includes phases 400, 402, 404, and 406. At phase 400, a first dosing step is defined for which the flow of the carrier gas, the first reactant, and the additive are simultaneously turned on. During phase 402, a purge step is defined wherein the flows of the first reactant and the additive are turned off, allowing the chamber to be purged by the continuing flow of the carrier gas. During phase 404, a second dosing step is defined wherein the flow of the second reactant is turned on. During phase 406, another purge step is defined wherein the flow of the second reactant is turned off, again allowing the continuing flow of the carrier gas to purge the chamber.

The deposition cycle (with additive) defined by phases 400, 402, 404, and 406, can be repeated for a predefined number of times so as to achieve a desired deposition thickness. For example, in some implementations, the deposition cycle with additive is repeated until a gap feature is approximately 50 to 80% filled, as measured from the bottom of the gap feature; in some implementations, the deposition cycle with additive is repeated until the gap feature is approximately 70% to 80% filled; in some implementations, the deposition cycle with additive is repeated until the gap feature is approximately 75% filled. It will be appreciated that parameters such as the partial pressures of the reactants and the additive can be tuned to provide a desired deposition profile.

Also shown with continued reference to FIG. 4 is an ALD deposition cycle without the additive, which includes phases 408, 410, 412, and 414. At phase 408, a first dosing step is defined for which the flow of the carrier gas and the first reactant are simultaneously turned on. During phase 410, a purge step is defined wherein the flow of the first reactant is turned off, allowing the chamber to be purged by the continuing flow of the carrier gas. During phase 412, a second dosing step is defined wherein the flow of the second reactant is turned on. During phase 414, another purge step is defined wherein the flow of the second reactant is turned off, again allowing the continuing flow of the carrier gas to purge the chamber.

The deposition cycle (without additive) defined by phases 408, 410, 412, and 414, can be repeated for a predefined number of times so as to achieve a desired deposition thickness. In some implementations, the deposition cycle without additive is repeated (at least) until the gap feature is completely filled.

When applying an ALD cycle with the additive, it will be appreciated that various parameters such as the partial pressures of the gases can be controlled so as to provide for a desired deposition profile in a gap feature. Broadly speaking, it is contemplated that the partial pressure of the additive will be comparatively low relative to that of the first reactant during the first dosing step in the ALD process. The partial pressure of the additive can be controlled so as to limit its diffusion to the bottom of the gap feature. In some implementations, the partial pressure of the additive is controlled so that it does not completely diffuse to the bottom of the gap feature. Whereas the partial pressure of the first reactant can be controlled to allow for its diffusion to the bottom of the gap feature in significantly greater concentration than that of the additive.

As the gap feature is filled by successive ALD cycles, the overall depth of the gap feature decreases. In some implementations, as the depth decreases, so the partial pressure of the additive is also decreased. In some implementations, when the depth decreases to a predefined level, or after a predefined number of ALD cycles (with the additive), the additive is no longer included in the first dosing step in subsequent ALD cycles.

It will be appreciated that the presently described method for performing ALD, with an additive that competes for adsorption sites with the first reactant during the first dosing step of an ALD cycle, can be utilized for deposition of any material by ALD, and can be tuned to enable gap-fill deposition of such material in high aspect ratio gap features that avoids formation of a void and/or a seam. In the following description, examples of possible materials that may be deposited in accordance with the presently described method are provided by way of example, without limitation.

Examples of materials that may be deposited by ALD include various elemental materials (e.g. C, Al, Si, Ti, Fe, Co, Ni, Cu, Zn, Ga, Ge, Mo, Ru, Rh, Pd, Ag, Ta, W, Os, Ir, Pt), oxides (e.g. oxides of any of the following: Li, Be, B, Mg, Al, Si, P, Ca, Sc, Ti, V, Cr, Mn, Fe, Co, Ni, Cu, Zn, Ga, Ge, Sr, Y, Zr, Nb, Ru, Rh, Pd, In, Sn, Sb, Ba, La, Ce, Pr, Nd, Sm, Eu, Gd, Tb, Dy, Ho, Er, Tm, Yb, Lu, Hf, W, Ir, Pt, Pb, Bi), nitrides (e.g. nitrides of any of the following: B, Al, Si, Ti, Cu, Ga, Zr, Nb, Mo, In, Hf, Ta, W), sulfides (e.g. sulfides of any of the following: Ca, Ti, Mn, Cu, Zn, Sr, Y, Cd, In, Sn, Sb, Ba, La, W), carbides, halides, etc.

It will be appreciated that the presently described implementations can be applied using the available reactants for ALD as are known in the art, in combination with an additive has described herein, to provide for control of the deposition in a gap feature. For a given ALD process, the additive should be competitive with the first reactant for available adsorption sites during the first dosing step. Various examples of reactants which are commonly utilized for ALD, and for which the present implementations may be applied, include inorganic reactants such as elemental and metal halides, and metal organic compounds such as alkyls, cyclopentadienyls, alkoxides, β-diketonates, amides, silyls and amidinates. These are commonly employed as first reactants or precursors within the context of the ALD sequence. Various second reactants (or co-reactants) may include $O_2$, $N_2$, $NH_3$, etc., which are pulsed during the second dosing step.

In some implementations, the first reactant in the first ALD half-reaction is a molecular precursor for a desired film material, and the second reactant in the second ALD half-reaction is configured to convert the adsorbed precursor to the desired film material. The second reactant may be a plasma in some implementations. In some implementations, the second reactant is configured to convert the adsorbed precursor to an oxide (e.g. using $O_3$, $H_2O$, $O_2$ plasma, etc.). In some implementations, the second reactant is configured to convert the precursor to a nitride (e.g. using $N_2$ plasma, $NH_3$ plasma, etc.).

One deposition material of interest is silicon dioxide ($SiO_2$). Deposition of a high quality silicon oxide (such as ($SiO_2$) is useful in various applications, such as formation of a shallow trench insulator (STI), pre-metal dielectric, 3D NAND, deep trenches, etc. Examples of ALD $SiO_2$ precursors include diisopropylaminosilane (DIPAS), bis(diethylamine)silane (BDEAS), bis(tertiary-butylamino)silane (BTBAS), $SiH_2DMA_2$, etc.

An additive that competes with the above $SiO_2$ precursors can be dosed along with the $SiO_2$ precursor during the first dosing step of an ALD process. The additive is configured to block surface —OH groups, thereby preventing adsorption of the competing $SiO_2$ precursor.

In some implementations, the additive may be an alcohol, such as n-butanol, n-propanol, isopropanol, etc. The alcohol will replace Si—OH bonds with Si—O-organic-ligand bonds that prevent the SiO2 precursor from adsorbing on the surface by reacting with the exposed —OH bonds (forming silicic esters).

In some implementations, the additive can be a molecule that is structurally similar to one or more of the ligands on the precursor material. Examples of precursor ligand-like additives include organoamines such as dimethylamine and monomethylamine, ammonia, etc.

In some specific implementations, DIPAS or BDEAS is utilized as an $SiO_2$ precursor in combination with dimethylamine, n-propanol, or isopropanol as an additive during the first dosing step of an ALD process. In some implementations, the partial pressure of DIPAS or BDEAS is in the range of approximately 0.1 to 25 Torr, whereas the partial pressure of the additive is in the range of approximately 0.001 to 15 Torr.

The foregoing examples for silicon oxide deposition are provided by way of example only, without limitation, as the principles of the present implementations can be applied to any ALD reactants, provided a suitable additive exhibiting the appropriate properties to effect control over the deposition profile is used. The partial pressures of the additive and the first reactant are configurable to control the deposition profile. Furthermore, as partial pressures of different molecules are variously affected by temperature, so the temperature can also be controlled to provide for desired partial pressures of the additive and the first reactant during the first dosing step.

The presently described implementations provide for the use of alcohols or other organic molecules as a growth inhibitor for ALD films. Notably, the additive is mixed with the reactant precursor during the first dosing step, therefore not requiring a separate step. The partial pressure of both the precursor and the additive can be modulated so as to limit the diffusion of the additive to the bottom of the gap (low partial pressures) while configuring the precursor to have a high partial pressure to more easily diffuse to the bottom of the gap. This differential in partial pressures leads to different growth rates along the depth of the gap feature, which can enable faster growth at the bottom and slower growth at the top. Unlike prior art methods, no plasma assistance is required, eliminating the potential damage of underlying layers. Furthermore, this approach can be extended to higher temperatures (>350 C) without risk of chemical reactions with underlying layers.

Though various implementations have been described with specific reference to ALD films, it will be appreciated that in other implementations, the principles of the present disclosure may also be applied for chemical vapor deposition (CVD) processes. More specifically, in a CVD process, a competitive additive that blocks adsorption sites can be included with the chemical vapor precursors. The partial pressure of the additive can be controlled so as to enable control of the extent of its diffusion to the bottom of gap features, and thereby enable tuning of the deposition profile of the CVD process. For example, the deposition profile can be controlled in this manner to effect increased deposition rates of the desired material with increasing depth in a gap feature.

Figure 5:
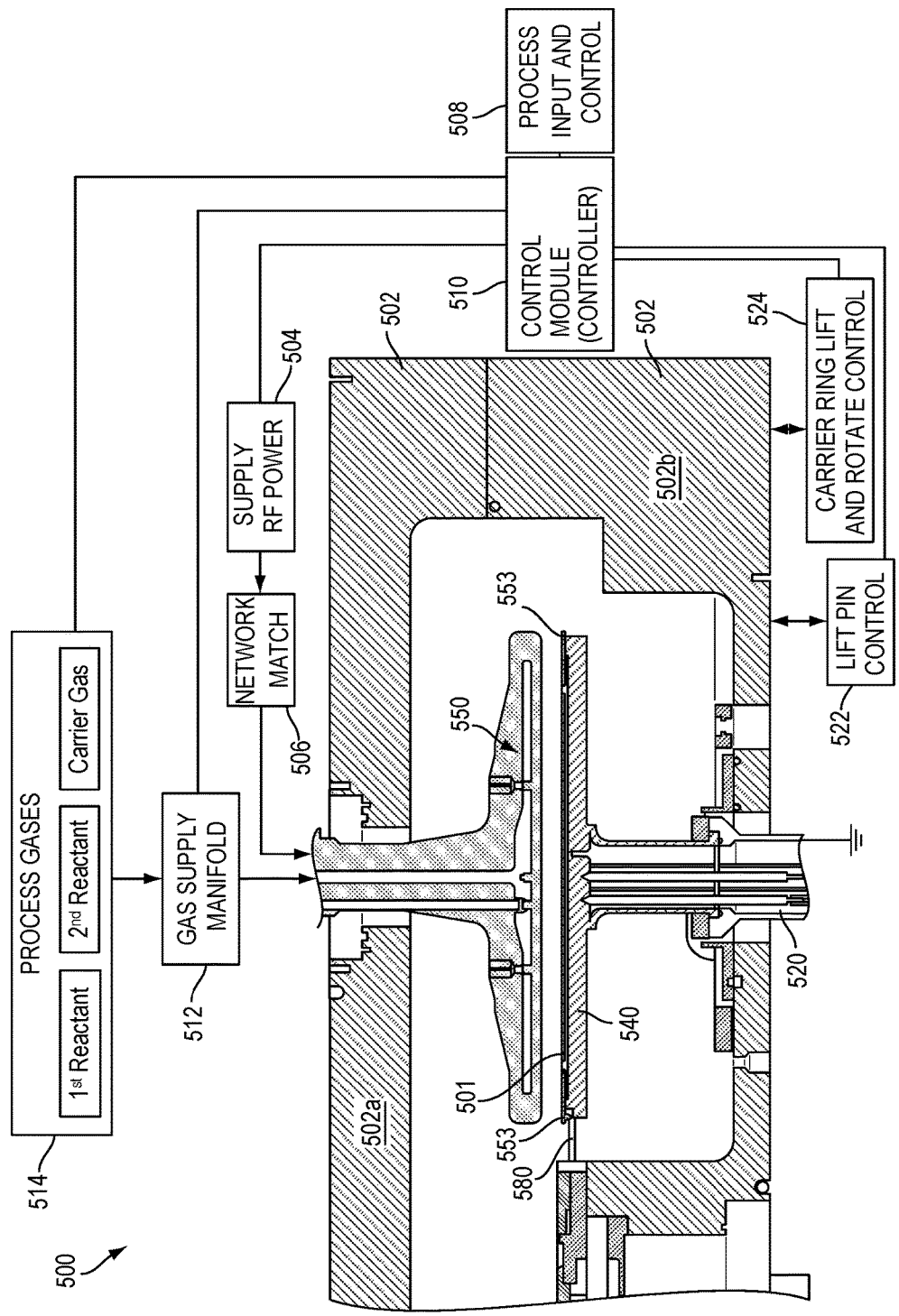
FIG. 5 illustrates a substrate processing system, which may be used to perform an ALD process on a substrate, in accordance with implementations of the disclosure.

FIG. 5 illustrates a substrate processing system 500, which may be used to perform an ALD or CVD process on a substrate 501. The system of FIG. 5 includes a chamber 502 having a lower chamber portion 502b and an upper chamber portion 502a. A center column is configured to support a pedestal 540, which in one embodiment is a powered electrode. The control module 510 is configured to operate the substrate processing system 500 by executing process input and control 508. The process input and control 508 may include process recipes, such as power levels, timing parameters, shuttle speed, RF power levels, ground settings, process gases, flow rates, mechanical movement of the substrate 501, etc., such for ALD film deposition over the substrate 501.

The center column is also shown to include lift pins 520, which are controlled by lift pin control 522. The lift pins 520 are used to raise the substrate 501 from the pedestal 540 to allow an end-effector to pick the substrate and to lower the substrate 501 after being placed by the end-effector. The substrate processing system 500 further includes a gas supply manifold 512 that is connected to process gases 514, e.g., gas chemistry supplies from a facility. Depending on the processing being performed, the control module 510 controls the delivery of process gases 514 (e.g. by opening or closing one or more valves) via the gas supply manifold 512. The chosen gases are then flowed into the shower head 550 and distributed in a space volume defined between the showerhead 550 face which faces the substrate 501 and the substrate 501 resting over the pedestal 540. In ALD processes, the gases can be reactants chosen for adsorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 553 that encircles an outer region of the pedestal 540. The carrier ring 553 is configured to sit over a carrier ring support region that is a step down from a substrate support region in the center of the pedestal 540. The carrier ring includes an outer edge side of its disk structure, e.g., outer radius, and a substrate edge side of its disk structure, e.g., inner radius, that is closest to where the substrate 501 sits. The substrate edge side of the carrier ring includes a plurality of contact support structures which are configured to lift the substrate 501 when the carrier ring 553 is lifted by forks 580. The carrier ring 553 is therefore lifted along with the substrate 501 and can be rotated to another station, e.g., in a multi-station system. In other embodiments, the chamber is a single station chamber. In still other embodiments, the chamber is part of a spatial ALD chamber which includes a shuttle and an edge ring. The edge ring may also be referred to as a focus ring, depending on the implementation.

In some implementations, the chamber is configured to enable plasma enhanced ALD (PEALD). In some implementations, the showerhead 550 is electrically coupled to power supply 504 (e.g., RF power source) via a match network 506, and the pedestal 540 is grounded, or vice versa. The power supply 504 may be defined from a single generator having two or more selectable and mutually exclusive oscillators. The power supply 504 is controlled by the control module 510. RF power is supplied to an electrode of the chamber so that a plasma can be generated for deposition. In the case of a spatial ALD chamber, the RF power source is coupled to the shuttle, which moves the substrate from process zone to process zone to complete one or more film deposition steps.

Figure 6:
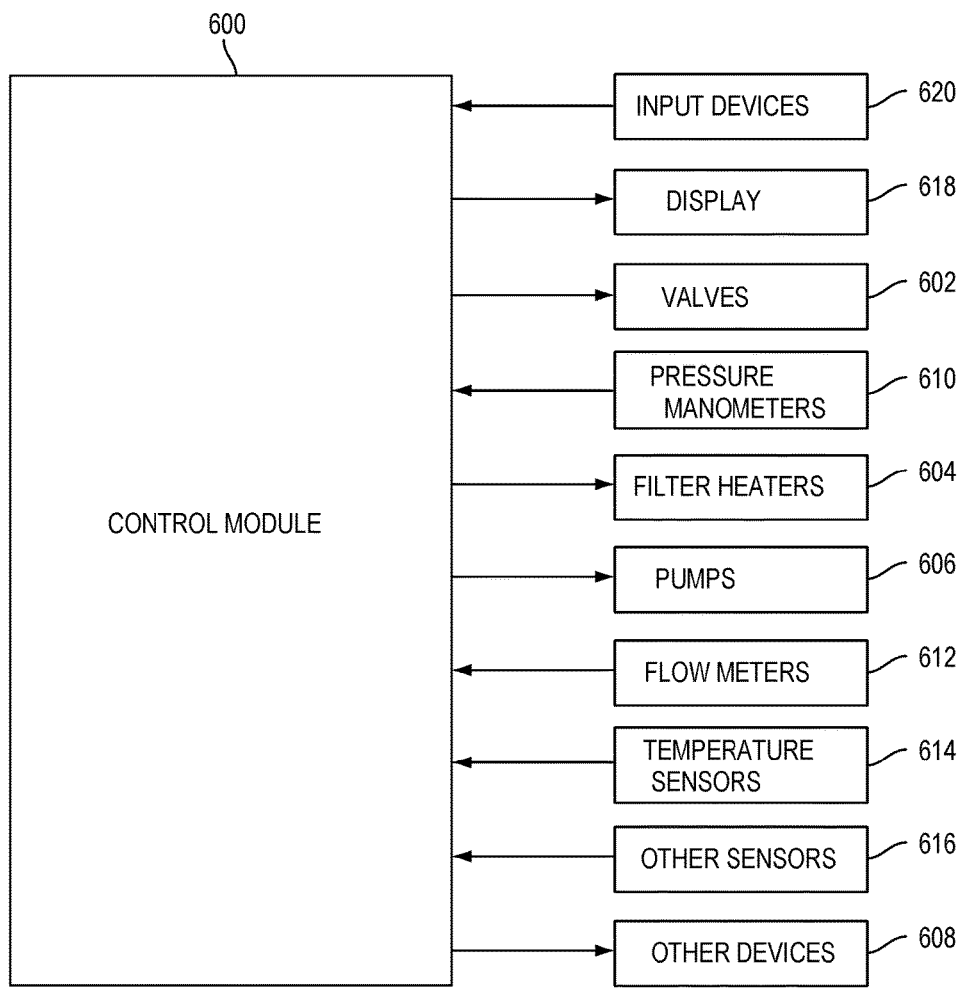
FIG. 6 shows a control module for controlling the systems of the present disclosure.

FIG. 6 shows a control module 600 for controlling the systems described above. For instance, the control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature, substrate temperature, RF power levels, substrate chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the disclosure in a single or multichamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of process gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method for performing atomic layer deposition (ALD) on a substrate, comprising:

exposing the substrate to a first reactant and an additive, such that exposure to the first reactant and exposure to the additive are initiated substantially simultaneously, the first reactant and the additive being configured to adsorb on exposed surfaces of the substrate, a partial pressure of the first reactant and a partial pressure of the additive being configured so that adsorption of the additive in a gap feature of the substrate decreases as depth increases in the gap feature, wherein the first reactant is a metal-containing precursor, and wherein the additive is an alcohol or an organoamine, wherein, during the exposure to the first reactant and the additive that is initiated substantially simultaneously, the partial pressure of the additive is configured to prevent diffusion of the additive to a bottom of the gap feature and the partial pressure of the first reactant is configured to enable diffusion of the first reactant to the bottom of the gap feature, wherein exposing the substrate to the first reactant and the additive includes, pulsing the first reactant and the additive into a carrier gas stream that is flowed into a process chamber in which the substrate is disposed, wherein pulsing the first reactant and the additive into the carrier gas stream includes simultaneously turning on a flow of the first reactant and a flow of the additive into the carrier gas stream;

after exposing the substrate to the first reactant and the additive, exposing the substrate to a second reactant, the second reactant configured to react with the adsorbed first reactant to form a thin film product, the thin film product being an oxide or a nitride, the second reactant configured to react with the adsorbed additive to remove the adsorbed additive from the substrate surface, wherein exposing the substrate to the second reactant includes, pulsing the second reactant into the carrier gas stream.

2. The method of claim 1, wherein the additive is configured to compete with the first reactant for available adsorption locations on the exposed surfaces of the substrate, the first reactant and the additive being configured to adsorb as a self-limiting monolayer, wherein adsorption of the additive prevents formation of the thin film product at locations where the additive adsorbed on the substrate surface.

3. The method of claim 2, wherein the partial pressure of the additive is less than the partial pressure of the first reactant.

4. The method of claim 2, wherein a temperature of the process chamber is controlled to provide for the partial pressures of the first reactant and the additive.

5. The method of claim 1, further comprising:
repeating the operations of exposing the substrate to the first reactant and the additive simultaneously, and exposing the substrate to the second reactant, for a predefined number of cycles so as to deposit multiple layers of the thin film product, wherein a deposition amount of the thin film product along sidewalls of the gap feature increases with increasing depth in the gap feature.

6. The method of claim 1,
wherein after exposing the substrate to the first reactant and the additive simultaneously, a first purge operation is performed to remove unreacted quantities of the first reactant and the additive from the process chamber;
wherein after exposing the substrate to the second reactant, a second purge operation is performed to remove unreacted quantities of the second reactant, and quantities of the deposited additive that have been removed from the substrate surface, from the process chamber.

7. The method of claim 6,
wherein performing the first purge operation includes continuing the flow of the carrier gas stream through the process chamber and evacuating the process chamber so as to remove the unreacted quantities of the first reactant and the additive from the process chamber;
wherein performing the second purge operation includes continuing the flow of the carrier gas stream through the process chamber and evacuating the process chamber so as to remove the unreacted quantities of the second reactant, and the quantities of the deposited additive that have been removed from the substrate surface, from the process chamber.

8. The method of claim 1,
wherein the thin film product is an oxide of silicon; and
wherein the first reactant is a silicon-containing precursor.

9. The method of claim 8, wherein the first reactant is diisopropylaminosilane (DIPAS), bis(diethylamine)silane (BDEAS) or bis(tertiarybuthylamine)silane (BTBAS).

10. A method for performing atomic layer deposition (ALD) on a substrate, comprising:
exposing the substrate to a first reactant and an additive, such that exposure to the first reactant and exposure to the additive are initiated substantially simultaneously, the first reactant and the additive being configured to adsorb on exposed surfaces of the substrate, a partial pressure of the first reactant and a partial pressure of the additive being configured so that adsorption of the additive in a gap feature of the substrate decreases as depth increases in the gap feature, wherein the first reactant is diisopropylaminosilane (DIPAS) or bis(diethylamine)silane (BDEAS), and wherein the additive is an alcohol or an organoamine,
wherein, during the exposure to the first reactant and the additive that is initiated substantially simultaneously, the partial pressure of the additive is configured to prevent diffusion of the additive to a bottom of the gap feature and the partial pressure of the first reactant is configured to enable diffusion of the first reactant to the bottom of the gap feature,
wherein exposing the substrate to the first reactant and the additive includes, pulsing the first reactant and the additive into a carrier gas stream that is flowed into a process chamber in which the substrate is disposed, wherein pulsing the first reactant and the additive into the carrier gas stream includes simultaneously turning on a flow of the first reactant and a flow of the additive into the carrier gas stream;
performing a first purge operation;
after exposing the substrate to the first reactant and the additive, exposing the substrate to a second reactant, the second reactant configured to react with the adsorbed first reactant to form a thin film product, the thin film product being silicon dioxide, the second reactant configured to react with the adsorbed additive to remove the adsorbed additive from the substrate surface,
wherein exposing the substrate to the second reactant includes, pulsing the second reactant into the carrier gas stream;
performing a second purge operation;
repeating the operations of exposing the substrate to the first reactant and the additive substantially simultaneously, performing the first purge operation, exposing the substrate to the second reactant, and performing the second purge operation, for a predefined number of cycles so as to deposit multiple layers of the thin film product, wherein a deposition amount of the thin film product along sidewalls of the gap feature increases with increasing depth in the gap feature.

11. The method of claim 10, wherein the additive is configured to compete with the first reactant for available adsorption locations on the exposed surfaces of the substrate, the first reactant and the additive being configured to adsorb as a self-limiting monolayer, wherein adsorption of the additive prevents formation of the thin film product at locations where the additive adsorbed on the substrate surface.

12. The method of claim 11, wherein the partial pressure of the additive is in the range of approximately 0.1 to 25 Torr, and wherein the partial pressure of the first reactant is in the range of approximately 0.001 to 15 Torr.

* * * * *